(12) United States Patent
Hsu et al.

(10) Patent No.: US 8,536,709 B1
(45) Date of Patent: Sep. 17, 2013

(54) WAFER WITH EUTECTIC BONDING CARRIER AND METHOD OF MANUFACTURING THE SAME

(75) Inventors: Chang-Sheng Hsu, Hsinchu (TW); Kuo-Yuh Yang, Hsinchu County (TW); Li-Che Chen, Pingtung County (TW); Yan-Da Chen, Taipei (TW); Chia-Wen Lien, Taoyuan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/531,606

(22) Filed: Jun. 25, 2012

(51) Int. Cl.
*H01L 23/48* (2006.01)
*H01L 23/52* (2006.01)
*H01L 29/40* (2006.01)

(52) U.S. Cl.
USPC ........................................ 257/764

(58) Field of Classification Search
USPC ......... 438/929, 118, 406, 455–459, 615–617, 438/14–18; 257/764, E21.53, E21.531, 625, 257/676, 779–783, 784–785, E27.137, E27.144, 257/E27.161, E23.023, E23.077, E21.088, 257/E21.122–E21.128, E21.48, E21.512, 257/E21.519, E21.567–E21.57
See application file for complete search history.

(56) References Cited

U.S. PATENT DOCUMENTS

| 7,361,523 B2 | 4/2008 | Sooriakumar |
| 2012/0013013 A1 * | 1/2012 | Sadaka et al. .................. 257/773 |
| 2012/0161307 A1 * | 6/2012 | Feng ............................. 257/690 |

* cited by examiner

*Primary Examiner* — Dao H Nguyen
*Assistant Examiner* — Tram H Nguyen
(74) *Attorney, Agent, or Firm* — Winston Hsu; Scott Margo

(57) ABSTRACT

A wafer with a eutectic bonding carrier and a method of manufacturing the same are disclosed, wherein the wafer comprises a thinned wafer, a eutectic bonding layer formed on the backside of said thinned wafer, a eutectic bonding carrier attached on said eutectic bonding layer, and a plurality of openings formed at the active side of said thinned wafer and exposing said eutectic bonding layer on the backside of said thinned wafer.

7 Claims, 4 Drawing Sheets

WAFER WITH EUTECTIC BONDING CARRIER AND METHOD OF MANUFACTURING THE SAME

BACKGROUND OF THE INVENTION

1. Field of the Invention

The present invention generally relates to a method for supporting a thinned wafer. More particularly, the present invention relates to a method for supporting a thinned wafer with a eutectic bonding carrier.

2. Description of the Prior Art

Wafer backside grinding (BSG) is conventionally employed to reduce the original thickness of a semiconductor wafer after the device fabrication and passivation. The profile of a wafer is reduced to a thickness suitable for assembling dies (obtained after a wafer singulation step) on substrate packages.

For some specific products, such as power ICs or MOSFETs, the wafer will be grinded to an ultra-thin dimension (ex. lower than 100 μm). Specific technologies are required to perform backside grinding to such an extreme scale. The current approach is to adhere the wafer to be grinded on a supporting carrier via an adhesive tape or glue. However, all currently available adhesive can't withstand high temperatures. For example, when the wafer is processed at a temperature higher than 400° C., the adhesive will deteriorate and won't be able to be properly removed. For this reason, wafers using the adhesive method can only be processed at low temperatures, such as in etching processes, physical vapor deposition (PVD) processes, or chemical vapor deposition (CVD) processes, which usually process at temperatures lower than 300° C.

Another approach to solve this problem is the so-called TAIKO process developed by DISCO. This process leaves an edge (approximately 3 mm) on the outermost circumference of the wafer and grinds only the inner circumference of the wafer to an ultra-thin scale. Using this method may lower the risks in thin wafer handling and potential warpage issues. However, in the TAIKO process, a specific edge ring device is required to hold and support the thinned wafer during the whole process flow. This may imply that all of the process tools, including WAT/testing tools, need to be modified to fit to this kind of technology. Moreover, since the wafer is held by an edge ring in the TAIKO process, the wafer center is very vulnerable to damage and may be easily broken, especially in the testing step, which the probes of testing tools are usually applied from the topside and backside of the wafer respectively.

Accordingly, it is still necessary to provide a novel method and structure for holding and processing the above-mentioned extremely thinned wafer.

SUMMARY OF THE INVENTION

To improve the above-mentioned drawbacks in the prior art, a new wafer supporting process and a structure are provided in the present invention. The method of the present invention features the steps of replacing the conventional adhesive layer and supporting carrier with a eutectic bonding layer and a eutectic bonding carrier. The eutectic bonding layer can withstand high temperatures, and the thinned wafer may, therefore, be processed at a high temperature in following wafer flow. Moreover, the eutectic bonding layer may readily serve as a lower electrode for the device manufactured on the wafer and facilitates the electrical test.

One object of the present invention is to provide a wafer with a eutectic bonding carrier comprising a thinned wafer, a eutectic bonding layer formed on the backside of said thinned wafer, a eutectic bonding carrier attached on said eutectic bonding layer, and a plurality of openings formed at the active side of said thinned wafer which expose said eutectic bonding layer on the backside of said thinned wafer.

Another object of the present invention is to provide a method for fabricating a wafer with a eutectic bonding carrier comprising the steps of forming a eutectic bonding layer on the backside of a wafer, attaching a eutectic bonding carrier on said eutectic bonding layer via the eutectic bonding, performing a thermal process to enhance the bonding between said eutectic bonding layer and said wafer, and forming a plurality of openings on the active side of said wafer which expose said eutectic bonding layer on the backside of said wafer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
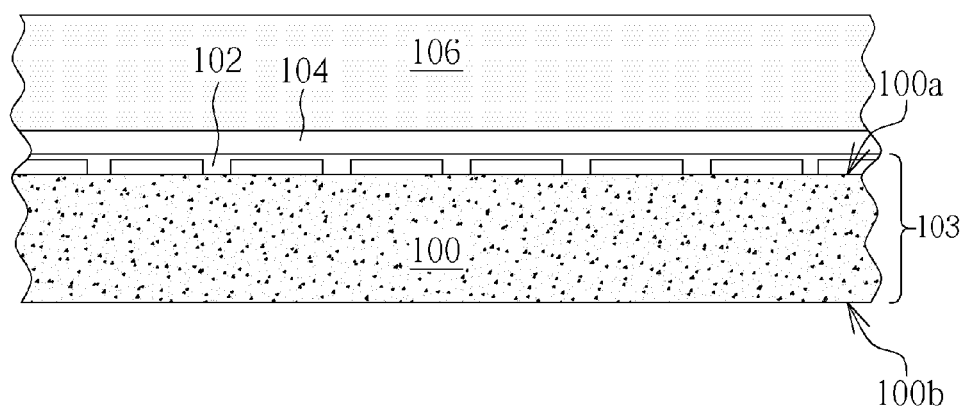
FIGS. 1-7 are cross-sectional views illustrating the flow of manufacturing a wafer with an eutectic bonding carrier in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part thereof, and in which are shown specific embodiments in which the invention may be practiced by way of illustration. These embodiments are described in sufficient details to allow those skilled in the art to practice the invention. Other embodiments may be utilized and structural, logical, and electrical changes may be made without departing from the scope of the present invention.

The embodiments will now be explained with reference to the accompanying drawings to provide a better understanding of the process of the present invention, wherein FIGS. 1-7 are cross-sectional views illustrating the flow of manufacturing a wafer with an eutectic bonding carrier in accordance to one embodiment of the present invention.

First, please refer to FIG. 1. A semiconductor substrate 100 is provided to serve as a base to form devices or layer structures thereon. In the present embodiment, the semiconductor substrate 100 comprises, but not limited to, a silicon substrate. In another embodiment, the substrate 100 may be, but not limited to an epitaxial silicon substrate, a silicon germanium (SiGe) substrate, a silicon carbide (SiC) substrate, or a silicon-on-insulator (SOI) substrate, etc. An active layer 102 is formed on the semiconductor substrate 100. The active layer 102 is a general representation of all the devices, components, and layers that can be formed on the semiconductor substrate 100, such as gates, NMOS regions and PMOS regions, P-wells and N-wells, CMOSs, resistors, inductors, diodes, IGBT (Insulated gate bipolar transistor), BJT (Bipolar junction transistor), MOSFET, various memory cells and/or metal lines. It may be a multilayer structure with components manufactured therein. The semiconductor substrate 100 and the active layer 102 may be generally regarded as a wafer 103 with an integrated circuit formed thereon. A temporary carrier 106, such as a transparent glass carrier, is adhered on the active layer 102 of wafer 103 via an adhesive layer 104. The temporary carrier 106 in this embodiment serves as a supporting and protecting structure of the wafer 103 in order to facilitate the following backside grinding (BSG) process. The adhesive layer 104 may be an UV tape or a hot melt adhesive tape, which may be deglued with a specific treatment.

Figure 2:
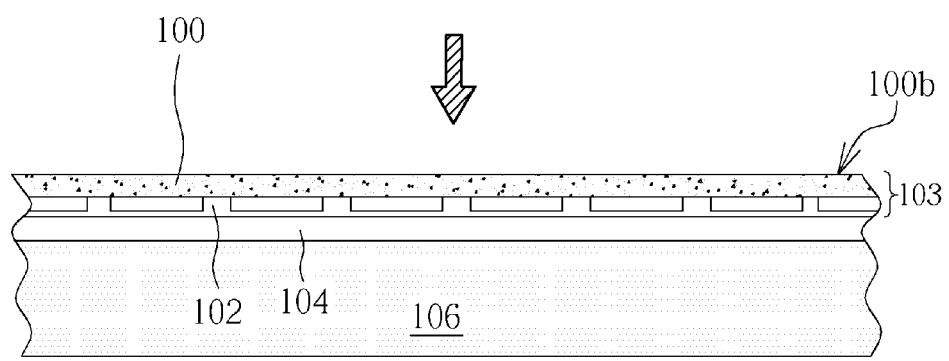

Please refer to FIG. 2. After the wafer 103 is adhered on the temporary carrier 106, a backside grinding (BSG) process is performed on the wafer to thin the semiconductor substrate 100. The backside grinding process may be performed in a chemical mechanical grinding tool (not shown). The thinning of the semiconductor substrate 100 is essential in the present invention in order to manufacture devices with desired electrical properties, such as better ON/OFF response time for a bipolar junction transistor (BJT) device. The thickness of the semiconductor substrate 100 may be thinned from 800 μm to 100 μm in a standard 8-inch wafer dimension, or even up to 10 μm. The temporary carrier 106 provides the support to the thinned semiconductor substrate 100 so that the thinned semiconductor substrate 100 may be easily handled in following processes and so that the active layer 102 can be prevented from any contamination or damage.

Optionally, some additional processes may be performed on the grinded surface of the semiconductor substrate 100 to obtain desired surface properties. For example, the wafer 103 may be processed in wet bench tools to clean the grinded surface of the semiconductor substrate 100 and to remove the debris or contaminants from the grinding process. An ion implantation process or a metallization process through local laser annealing may be performed on the thinned semiconductor substrate 100 to form a predetermined p-type or n-type doped region or I/O terminals. Additionally, the backside of the thinned semiconductor substrate 100 may undergo lithography and etching processes to form a predetermined circuit pattern.

Figure 3:
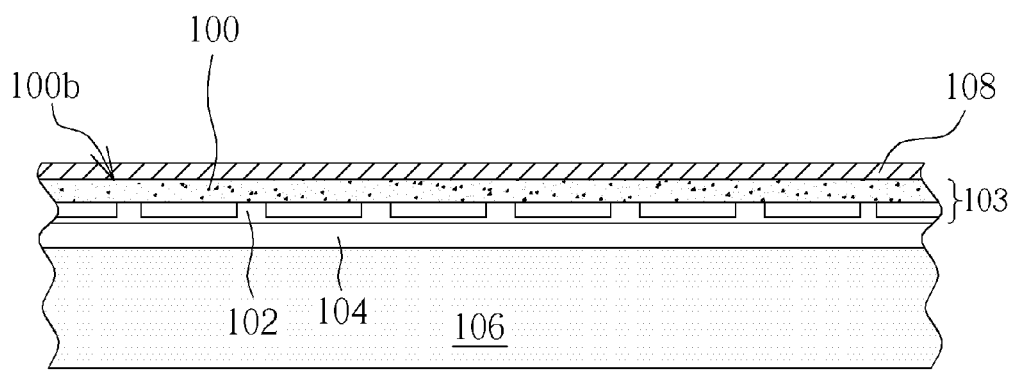

Please refer to FIG. 3. After the backside grinding process, a eutectic bonding layer 108 is formed on the grinded surface (i.e. the backside surface) of the thinned semiconductor substrate 100. In present invention, the eutectic bonding layer 108 is used to establish the eutectic bonding with the other carrier, which is referred herein as the eutectic bonding carrier. For this purpose, the eutectic bonding layer 108 may include materials capable of forming eutectic bonding with other corresponding materials, such as Au, Ag, or Al. In the present invention, the eutectic bonding layer 108 could be Ti—Ni—Au, Al—Ti—Ni—Au, Ti—Ni—Ag or Al—Ti—Ni—Ag multilayer structure. Au is an excellent element to form a eutectic bonding with Si at low temperatures, and a eutectic bonding layer 108 including Au composition can, therefore, readily establish the eutectic bonding with conventional Si substrate, which is an excellent candidate as the eutectic bonding carrier in the present invention.

Since the adhesive layer 104 between the wafer 103 and the temporary carrier 106 can't withstand high temperatures, the wafer 103 can't undergo with high temperature processes, such as the rapid thermal annealing (RTA) and the alloy processes that generally processed at temperatures way higher than 400° C. For this concern, a eutectic bonding carrier (shown in the following embodiment) and the eutectic bonding layer 108 will be utilized to replace the previous temporary carrier 106 and the adhesive layer 104. For the same reason, the eutectic bonding layer 108 in the present invention is formed through low temperature processes, such as evaporator, physical vapor deposition (PVD) or chemical vapor deposition (CVD) processes, which perform at temperatures lower than 300° C., in order to avoid the deterioration of the adhesive layer 104.

Figure 4:
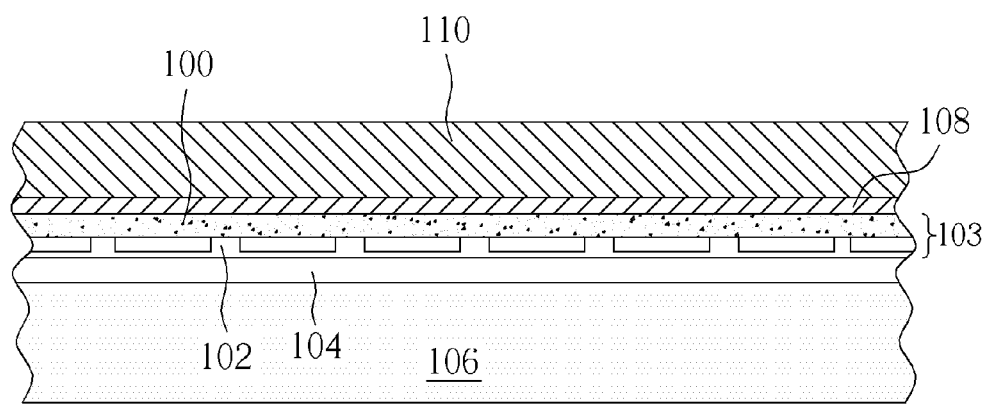

Please refer to FIG. 4. After forming the eutectic bonding layer 108 on the thinned semiconductor substrate 100, a eutectic bonding carrier 110 is attached on the eutectic bonding layer 108 via eutectic bonding. In the present invention, the eutectic bonding carrier 110 may comprise materials capable of forming eutectic bonding with the corresponding eutectic bonding layer 108. The eutectic bonding between eutectic bonding layer 108 and the eutectic bonding carrier 110 may comprise, but not limited to, Si—Au, In—Au, or Al—Ge bonding. These bondings may be established through low temperature processes, ex. at temperatures lower than 300° C. The eutectic bonding carrier 110 preferably is a Si substrate and the eutectic bonding layer 108 is a Ti—Ni—Au multilayer, wherein the eutectic bonding can be formed easily between Si and Au elements. Furthermore, the Ni layer may function as a stop layer, for example in a laser drilling process for forming desired openings on the wafer 103. In the present invention, the eutectic bonding carrier 110 may replace the temporary carrier 106 as a support to hold the thinned wafer 103. In comparison with the previous adhesive layer 104, the use of the eutectic bonding layer 108 enables the wafer 103 to be processed at a high temperature (ex. higher than 400° C.) in following processes. That is one of the reasons why the eutectic bonding layer 108 is adopted in present invention.

Figure 5:
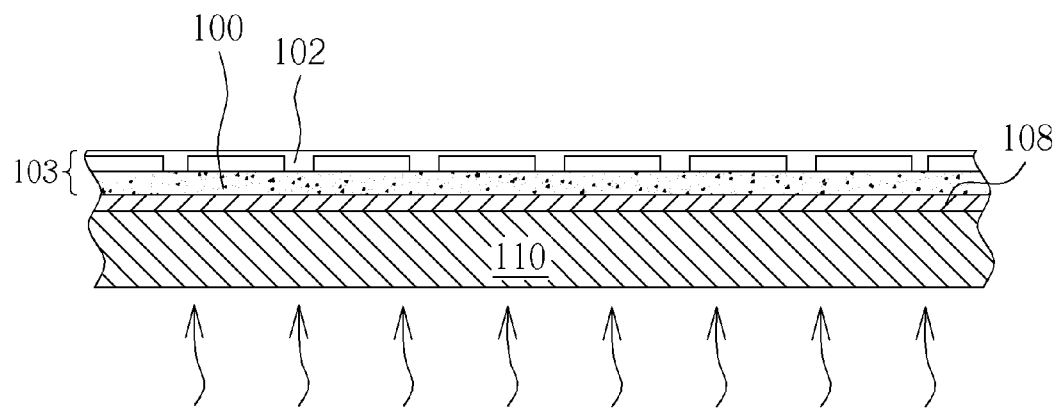

Please refer to FIG. 5. After attaching the eutectic bonding carrier 110 on the eutectic bonding layer 108, the temporary carrier 106 is removed from the wafer 103. The temporary carrier 106 may be removed through performing some treatment to the adhesive layer 104 adhering the temporary carrier 106 and the active layer 102. For example, if the adhesive layer 104 is a UV tape or a hot melt tape, performing a UV light treatment or a thermal treatment may cure and deglue the adhesive layer 104, thereby easily removing the temporary carrier 106 from the wafer 103 without damaging the active layer 102 of wafer 103. The removal of the adhesive layer 104 that doesn't resist to high temperatures enables the wafer 103 to be processed at a high temperature in the following wafer flow. As shown in FIG. 5, once the temporary carrier 106 is removed, a high temperature (ex. higher than 400° C.) thermal process may be performed on the wafer 103, which is supported by the eutectic bonding carrier 110. This high temperature thermal process may enhance the weak bonding between the eutectic bonding layer 108 and the semiconductor substrate 110, and the device manufactured on the wafer have lower contact resistance to metal.

Figure 6:
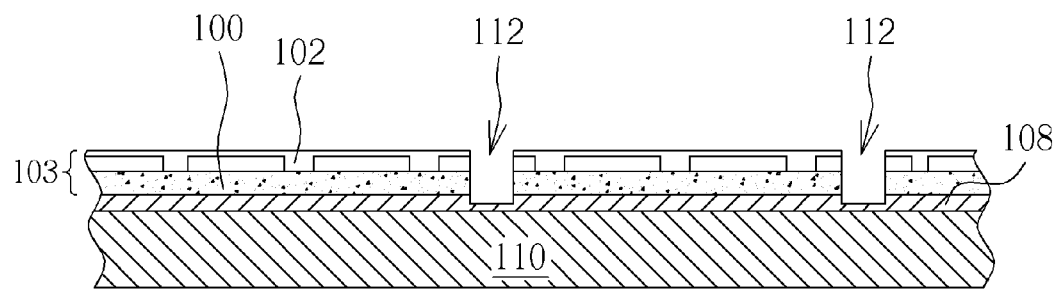
Figure 7:
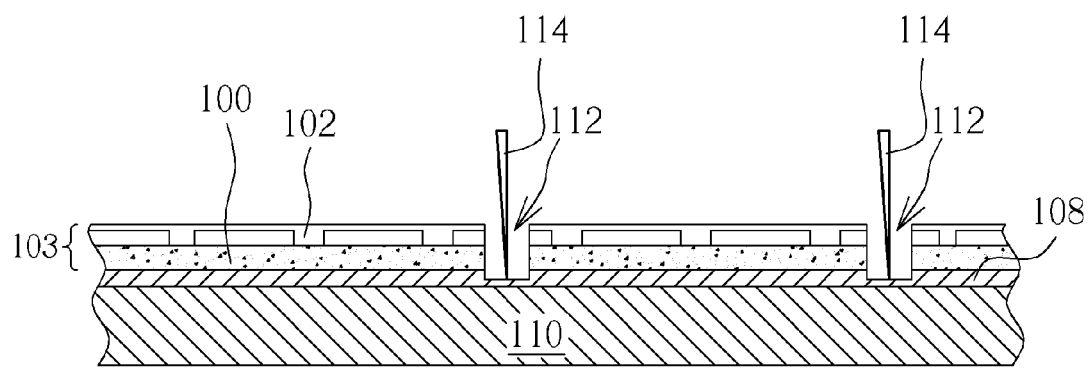

Please refer to FIG. 6. The removal of the temporary carrier 106 exposes the active layer 102 of the wafer 103. At this stage, the thinned wafer 103 is supported by the eutectic bonding carrier 110. As shown in FIG. 6, since the active layer 102 is exposed, a plurality of openings 112 may be formed in the active layer 102 through lithography/etching processes, sawing or laser drilling. The opening 112 extends through the wafer 103 and exposes the eutectic bonding layer 108 on the backside of semiconductor substrate 100. The openings 112 are preferably formed through laser drilling, so that the Nicontaining eutectic bonding layer 108 under the semiconductor substrate 100 may serve as a stop layer to stop the drilling exactly on the eutectic bonding layer 108. On the other hand, the eutectic bonding layer, such as Ti—Ni—Au multilayer, may also serve as a lower electrode for the device formed in the active layer 102. The corresponding upper electrode (not shown) of the device may be formed on the active layer 102. According to this design, as shown in FIG. 7, the probes 114 of the testing tool may contact the upper electrodes and the lower electrodes of the device to be tested from the active side of the wafer 103. Besides, the thin eutectic bonding layer 108 in this stage is supported by the eutectic bonding carrier 110 and has a better mechanical strength. The thinned wafer in the present invention may be used to enhance vertical bipolar performance. The probes of the testing tools may contact the above-mentioned all electrodes from the active side of wafer. The design of the present invention resolves the problems of the ultra-thin wafer being vulnerable to the probes of the conventional testing tools when the probes are respectively applied on the testing pads on the active side and the backside of the wafer.

To summarize, the advantages of the wafer with the eutectic bonding carrier of the present invention may comprise: (1) the thinned wafer may be processed at high temperatures because the conventional adhesive layer and supporting carrier are replaced by the eutectic bonding layer and the eutectic bonding carrier, which can withstand high temperatures; the high temperature process may enhance the bonding between the eutectic bonding layer and the semiconductor substrate; (2) the eutectic bonding layer may serve as a lower electrode formed on the supporting eutectic bonding carrier for the device manufactured on the wafer, so that all testing probes contact the electrode from one side of the wafer and common testing tools may be readily used to test the devices formed on the wafer without any modification.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a wafer with a eutectic bonding carrier, comprising the steps of:

forming a eutectic bonding layer as a lower electrode on the backside of a wafer, wherein said wafer comprises at least one upper electrode on the active side of said wafer;
attaching a eutectic bonding carrier on said eutectic bonding layer via eutectic bonding;
performing a thermal process to enhance the bonding between said eutectic bonding layer and said wafer;
forming a plurality of openings on the active side of said wafer and exposing said eutectic bonding layer on the backside of said wafer; and
performing a probe test through said at least one upper electrode and said eutectic bonding layer.

2. A method of fabricating a wafer with a eutectic bonding carrier according to claim 1, further comprising the following steps before forming said eutectic bonding layer on the backside of a wafer:

attaching a temporary carrier on the active side of said wafer via adhesive properties; and
performing a grinding process on the backside of said wafer.

3. A method of fabricating a wafer with a eutectic bonding carrier according to claim 2, further comprising performing a backside process after said grinding process and before forming said eutectic bonding layer, wherein said backside process comprises a wet bench process, an ion implantation process, a metallization process, a lithography process, or an etching process.

4. A method of fabricating a wafer with a eutectic bonding carrier according to claim 2, further comprising the step of removing said temporary carrier after attaching said eutectic bonding carrier.

5. A method of fabricating a wafer with a eutectic bonding carrier according to claim 1, wherein said eutectic bonding layer is formed by evaporator, chemical vapor deposition (CVD) or physical vapor deposition (PVD) at a temperature below 300° C.

6. A method of fabricating a wafer with a eutectic bonding carrier according to claim 1, wherein said thermal process comprises a rapid thermal process (RTP), an alloy process, or a furnace process at a temperature higher than 400° C.

7. A method of fabricating a wafer with a eutectic bonding carrier according to claim 1, wherein said plurality of openings is formed through laser drilling, sawing, or lithography/etching process.

* * * * *